US010004139B2

(12) United States Patent
Yeh

(10) Patent No.: US 10,004,139 B2
(45) Date of Patent: Jun. 19, 2018

(54) FLEXIBLE PRINTED CIRCUIT BOARD OF LIGHT GUIDE MODULE AND CUT-OUT STRUCTURE THEREOF

(71) Applicant: Chicony Electronics Co., Ltd., New Taipei (TW)

(72) Inventor: Liang-Chun Yeh, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 115 days.

(21) Appl. No.: 15/238,651

(22) Filed: Aug. 16, 2016

(65) Prior Publication Data

US 2018/0054883 A1 Feb. 22, 2018

(51) Int. Cl.

*H05K 1/02* (2006.01)
*F21V 19/00* (2006.01)
*H05K 1/18* (2006.01)
*H01H 13/83* (2006.01)

(52) U.S. Cl.

CPC ........... *H05K 1/028* (2013.01); *F21V 19/001* (2013.01); *H01H 13/83* (2013.01); *H05K 1/0274* (2013.01); *H05K 1/189* (2013.01)

(58) Field of Classification Search

CPC H05K 1/00; H05K 1/28; H05K 1/274; H05K 1/275; H05K 3/00; H05K 7/00
USPC ........ 174/254, 535; 361/373, 736, 749, 752; 29/829
See application file for complete search history.

(56) References Cited

U.S. PATENT DOCUMENTS 6,373,709 B1 * 4/2002 Hino ...................... B82Y 10/00 174/535
6,549,419 B1 * 4/2003 Nakano .................. H05K 1/189 174/254
8,000,105 B2 * 8/2011 Hinkle ...................... G06F 1/20 361/697
2005/0018409 A1 * 1/2005 Hirakata ................ H05K 1/028 361/752
2010/0073233 A1 * 3/2010 Young ................ H01Q 21/0025 342/373
2010/0271789 A1 * 10/2010 Dubois ................ H05K 1/0275 361/749
2013/0076597 A1 * 3/2013 Becze ................... G06F 3/1438 345/1.3
2013/0082585 A1 * 4/2013 Becze ................... G06F 3/1438 312/223.2
2016/0205766 A1 * 7/2016 Blum ................... H05K 1/0216 361/749

* cited by examiner

*Primary Examiner* — Xiaoliang Chen
(74) *Attorney, Agent, or Firm* — Chun-Ming Shih; HDLS IPR Services

(57) ABSTRACT

A flexible printed circuit board of a light guide module and a cut-out structure thereof. The flexible printed circuit board is made by cutting an FPC material and is formed after folding and unfolding. The flexible printed circuit board includes two light emitting plates and an extension strip. The two light emitting plates each has a connection portion. The extension strip is integrally connected between the two connection portions. Two ends of the two light emitting plates and the extension strip have two fold lines respectively, so that the extension strip is disposed between the two light emitting plates along an extension direction to separate the two light emitting plates away from each other.

7 Claims, 5 Drawing Sheets

1

FLEXIBLE PRINTED CIRCUIT BOARD OF LIGHT GUIDE MODULE AND CUT-OUT STRUCTURE THEREOF

TECHNICAL FIELD

The present invention relates to a keyboard element and, in particular, to a flexible printed circuit board of a light guide module and a flexible printed circuit board cut-out structure which can be applied in an illuminated keyboard.

BACKGROUND

A light emitting module on an illuminated keyboard usually consists of a flexible printed circuit (FPC) board and a light emitting diode (LED), and is disposed at one side of the keyboard to radiate light toward the other side, so that light is radiated from below keys of the keyboard, and users can see the keys at night or when there is insufficient light.

Normally, keyboards are of rectangular shape and are elongated in a lateral dimension. Therefore, a light emitting module is usually disposed at an upper side or a lower side of the keyboard, so light can be projected in a vertical direction to obtain uniform illumination. However, this configuration raises a cost in an FPC material. Although the cost in the FPC material can be reduced by disposing the light emitting module in the middle in order to project light laterally to left and right sides, the light emitting diodes (LEDs) are disposed too centralized, so an overheating problem may occur. Moreover, since the keyboard is longer in the lateral dimension, a light path is longer in the lateral dimension, and it is difficult to achieve uniform illumination (light intensity is not uniform because the light intensity decreases as the distance increases).

Accordingly, the inventor made various studies to overcome the above-mentioned problems, on the basis of which the present invention is accomplished.

SUMMARY

It is an object of the present invention to provide a flexible printed circuit board (FPC) of a light guide module and a cut-out structure thereof, whereby a material is arranged centralized, so the light guide module can obtain uniform light intensity without increasing costs in the FPC material, and at the same time the present invention facilitates making design and adjustment according to a length of a keyboard.

Accordingly, the present invention provides a flexible printed circuit board of a light guide module, made by cutting a flexible printed circuit (FPC) material and formed by folding and unfolding. The flexible printed circuit board of the light guide module comprises two light emitting plates and an extension strip. The two light emitting plates are arranged side by side in spaced apart relationship before being unfolded, and each of the two light emitting plates includes a connection portion. The extension strip is integrally connected between the two connection portions, and the extension strip and the two light emitting plates are arranged side by side before being folded. Each of two ends of the two light emitting plates and the extension strip forms a fold line after being folded, so that the extension strip is disposed between the two light emitting plates in an extension direction to separate the two light emitting plates away from each other, and a distance between the two light emitting plates is greater than the distance before unfolding.

Accordingly, the present invention provides a flexible printed circuit board cut-out structure of a light guide module, made by cutting a flexible printed circuit material. The flexible printed circuit board cut-out structure of the light guide module comprises two light emitting plates and an extension strip. The two light emitting plates are arranged side by side in spaced apart relationship and each have a connection portion at one side where the two light emitting plates are adjacent to each other. The extension strip is integrally connected between the two connection portions, and the extension strip and the two light emitting plates are arranged side by side.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
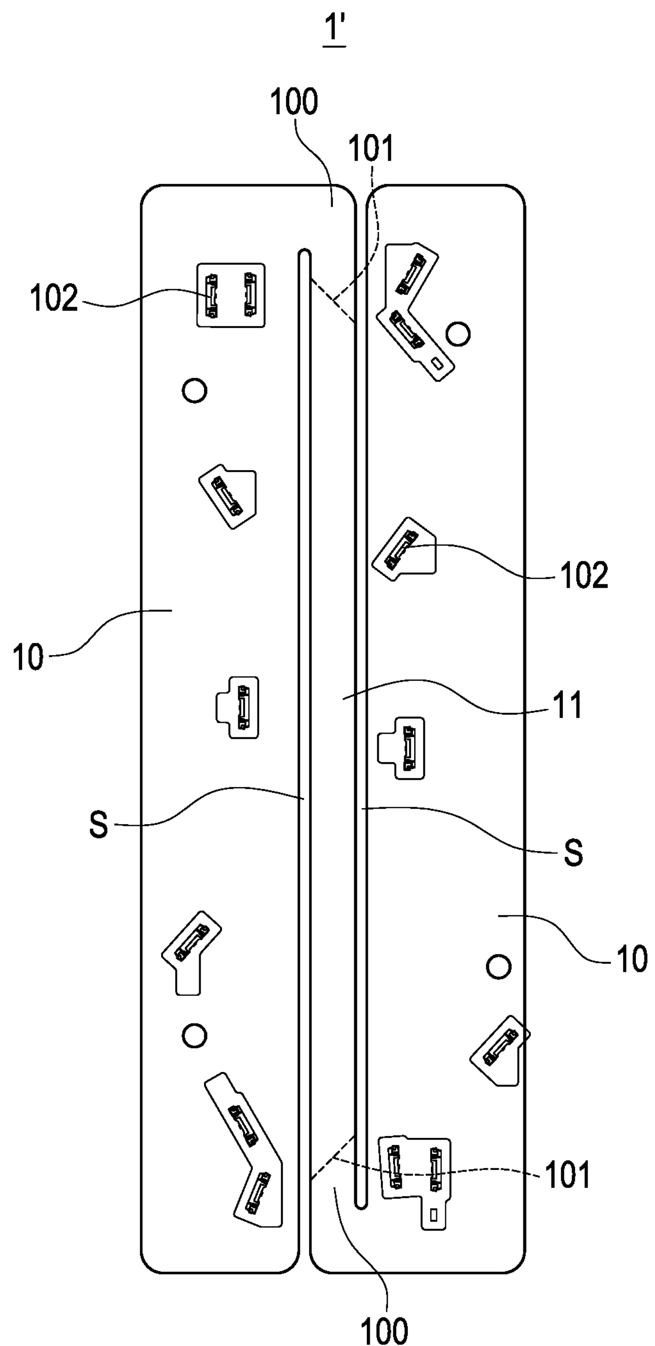
FIG. 1 is a plan view showing a flexible printed circuit board cut-out structure according to the first embodiment of the present invention.
Figure 2:
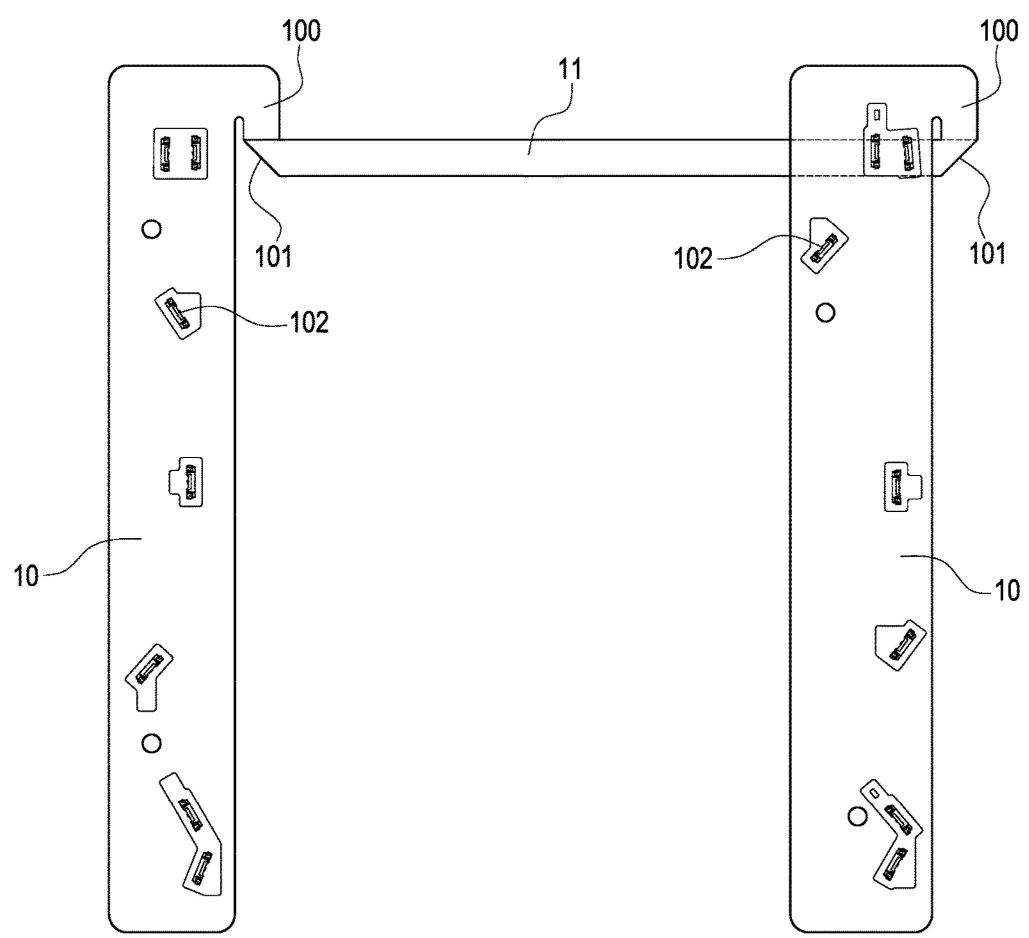
FIG. 2 is a plan view showing folding according to the first embodiment of the present invention.

Please refer to FIGS. 1 and 2 which are a plan view showing a flexible printed circuit board cut-out structure and a plan view showing folding according to the first embodiment of the present invention. The present invention provides a flexible printed circuit (FPC) board of a light guide module and a cut-out structure thereof. The flexible printed circuit board 1 is made by cutting an FPC material (not illustrated), and the flexible printed circuit board 1 is formed after folding and unfolding. The flexible printed circuit board cut-out structure 1' (as shown in FIG. 1) is cut out from the FPC material and includes two light emitting plates 10 and an extension strip 11.

The two light emitting plates 10 are rectangular in shape and are arranged side by side in spaced apart relationship. Each of the two light emitting plates 10 includes a connection portion 100 at one side where the two light emitting plates 10 are adjacent to each other. In the present embodiment, the two connection portions 100 respectively protrude from two opposite distal ends at one side where the two light emitting plates are adjacent to each other. The two connection portions 100 face each other, and thereby the extension strip 11 is integrally connected between the two connection portions 100, so that the two light emitting plates 10 and the extension strip 11 are arranged side by side along their lengthwise direction before the flexible printed circuit board cut-out structure 1' is folded to form the flexible printed circuit board 1. In other words, the two light emitting plates 10 are arranged side by side in spaced apart relationship before being unfolded, and the extension strip 11 and the two light emitting plates 10 are arranged side by side before being folded, so area arrangement is more centralized, which preventing the FPC material from being wasted when the FPC material is cut.

Referring to FIG. 2, when it is desired to unfold the flexible printed circuit board cut-out structure 1' to form the flexible printed circuit board 1, this can be achieved mainly by folding where the two connection portions 100 are adjacent to the extension strip 11. To be specific, each of two ends of the two light emitting plates 10 and the extension strip 11 forms a fold line 101 after folded, and the fold line 101 is inclined, so that the extension strip 11 is disposed between the two light emitting plates 10 in a horizontal extension direction to separate the two light emitting plates 10 away from each other, and a distance between the two light emitting plates 10 is greater than the distance before unfolding. Therefore, light emitting elements 102 on the two light emitting plates 10 can be disposed in a proper distance (varying depending on a length of a keyboard) to provide more uniform light intensity. Besides, after the distance between the two light emitting plates 10 becomes larger, the present invention eliminates heat dissipation and overheating problems of a prior art resulting from light emitting elements too centralized on a flexible printed circuit board of the prior art. Moreover, before the flexible printed circuit board cut-out structure 1' is folded, the two light emitting plates 10 and the extension strip 11 are arranged centralized, so it is able to use the FPC material effectively, and thus costs in the FPC material do not increase and a waste of the FPC material is prevented.

Therefore, by means of the above-mentioned structure and configurations, the flexible printed circuit board of the light guide module of the present invention can be carried out.

Figure 3:
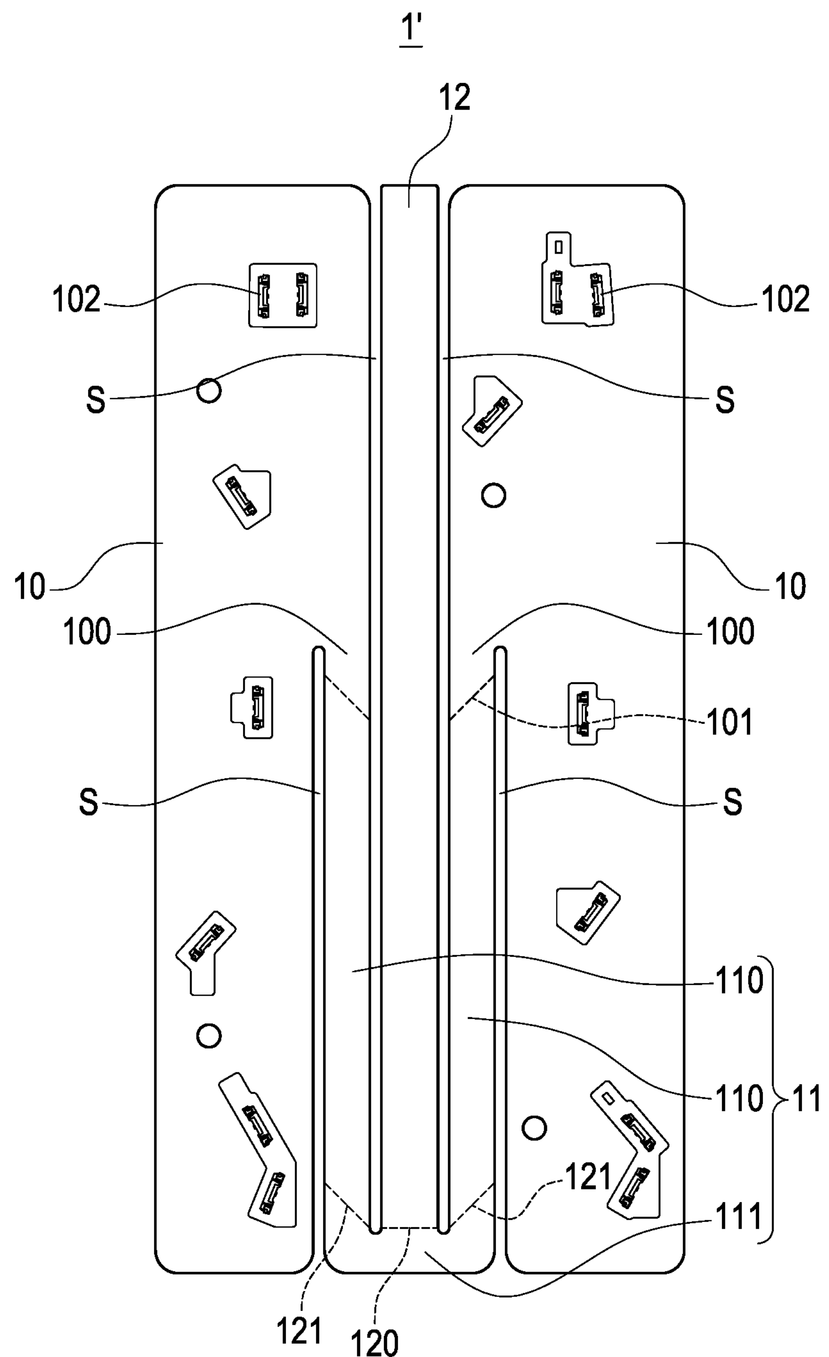
FIG. 3 is a plan view showing the flexible printed circuit board cut-out structure according to the second embodiment of the present invention.
Figure 4:
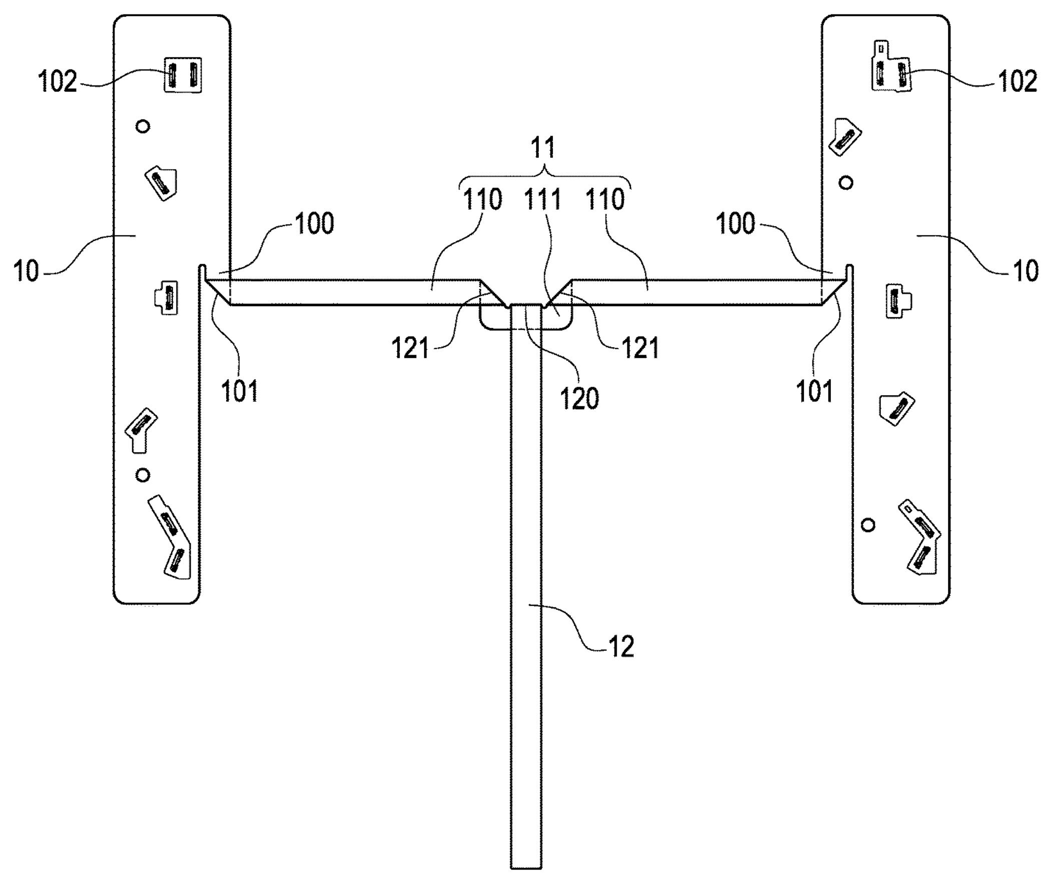
FIG. 4 is a plan view showing folding according to the second embodiment of the present invention.

Please refer to FIGS. 3 and 4, a plan view showing the flexible printed circuit board cut-out structure and a plan view showing folding according to the second embodiment of the present invention. In the present embodiment, the extension strip 11 includes two extension sections 110 and a connection section 111 integrally connected between the two extension sections 110, and a flat cable section 12 is integrally connected to the connection section 111 connected between the two extension sections 110. The two extension sections 110 are integrally connected to the two connection portions 100 of the two light emitting plates 10 respectively, so that the flat cable 12 is disposed between the two extension sections 110 and also between the two light emitting plates 10. When it is desired to unfold, unfolding shown in FIG. 4 and the aforesaid objectives and effects can be achieved since the fold line 101 is formed inclined between each of the two light emitting plates 10 and one end of each of the two extension sections 110, a straight fold line 120 is also formed between the connection section 111 and the flat cable section 12, and an inclined fold line 121 is formed at the other end of each of the two extension sections 110.

Figure 5:
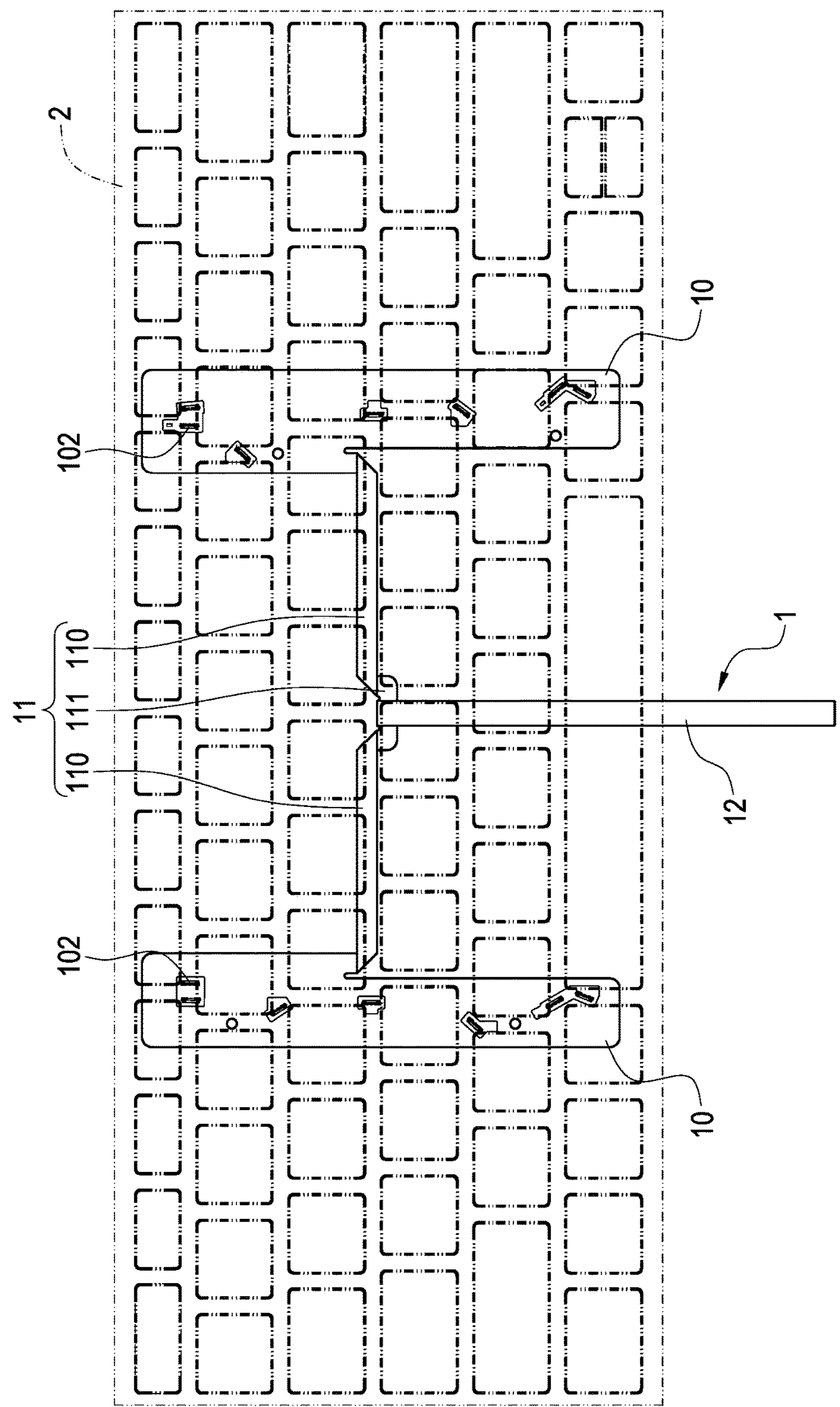
FIG. 5 is a schematic plan view showing the second embodiment applied to a key module.

Accordingly, as shown in FIG. 5, the flexible printed circuit board cut-out structure 1' of the present invention can form the flexible printed circuit board 1 after folding and unfolding, and a plurality of the light emitting elements 102 such as light emitting diodes (LEDs) can be disposed on the two light emitting plates 10 of the flexible printed circuit board 1, so that the flexible printed circuit board 1 can be disposed in a keyboard module 2, and the two light emitting plates 10 can be adjusted and arranged to accommodate a length of the keyboard module 2, and thus uniform light intensity can be obtained.

In summary, the present invention certainly can achieve anticipated objectives and solve the conventional defects. The present invention also has novelty and non-obviousness, so the present invention completely complies with the requirements of patentability. Therefore, a request to patent the present invention is filed pursuant to patent law. Examination is kindly requested, and allowance of the present application is solicited to protect the rights of the inventor.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A flexible printed circuit board of a light guide module, made by cutting a flexible printed circuit (FPC) material and formed by folding and unfolding, comprising:

two light emitting plates, the two light emitting plates being arranged side by side in spaced apart relationship before being unfolded, each of the two light emitting plates including a connection portion; and an extension strip, the extension strip being integrally connected between the two connection portions, the extension strip and the two light emitting plates being arranged side by side before being folded, wherein each of two ends of the two light emitting plates and the extension strip forms a fold line after being folded, so that the extension strip is disposed between the two light emitting plates in an extension direction, and the two light emitting plates are pulled away from each other, and a distance between the two light emitting plates is greater than the distance before being unfolding.

2. The flexible printed circuit board of the light guide module of claim 1, wherein each of the two light emitting plates includes a plurality of light emitting elements.

3. The flexible printed circuit board of the light guide module of claim 1, wherein before being unfolded, the two connection portions respectively protrude from two opposite distal ends at one side where the two light emitting plates are adjacent to each other.

4. The flexible printed circuit board of the light guide module of claim 1, wherein the two light emitting plates are rectangular in shape.

5. The flexible printed circuit board of the light guide module of claim 1, wherein the extension strip includes two extension sections and a connection section integrally connected between the two extension sections, the two extension sections are integrally connected to the two connection portions of the two light emitting plates respectively, and a fold line is formed between each of the two extension sections and the connection section.

6. The flexible printed circuit board of the light guide module of claim 5, wherein a flat cable section is integrally connected to the connection section connected between the two extension sections.

7. The flexible printed circuit board of the light guide module of claim 6, wherein a fold line is also formed between the connection section and the flat cable section.

* * * * *